US006417075B1

(12) United States Patent
Haberger et al.

(10) Patent No.: US 6,417,075 B1
(45) Date of Patent: Jul. 9, 2002

(54) METHOD FOR PRODUCING THIN SUBSTRATE LAYERS

(75) Inventors: Karl Haberger, Planegg; Andreas Plettner, Feldafing, both of (DE)

(73) Assignee: Fraunhofer-Gesellschaft zur Forderung der Angewandten Forschung e.V., Munchen (DE)

( * ) Notice: Subject to any disclaimer, the term of this patent is extended or adjusted under 35 U.S.C. 154(b) by 0 days.

(21) Appl. No.: 09/720,154

(22) PCT Filed: Jun. 22, 1999

(86) PCT No.: PCT/DE99/01826

§ 371 (c)(1),
(2), (4) Date: Mar. 22, 2001

(87) PCT Pub. No.: WO99/67820

PCT Pub. Date: Dec. 29, 1999

(30) Foreign Application Priority Data

Jun. 22, 1998 (DE) .......................................... 198 27 717

(51) Int. Cl.[7] .................... H01L 21/30; H01L 21/46; H01L 21/76; H01L 27/01; H01L 27/12
(52) U.S. Cl. ........................ 438/459; 438/406; 438/456; 438/967; 257/347
(58) Field of Search ................................ 438/459, 406, 438/456, 967, 458, 455, 421, 977, FOR 488, FOR 477; 257/347, 352; 148/DIG. 12

(56) References Cited

U.S. PATENT DOCUMENTS

| 4,638,552 | A | 1/1987 | Shimbo et al. |
| 4,710,794 | A | 12/1987 | Koshino et al. |
| 4,784,970 | A | 11/1988 | Solomon |
| 5,051,378 | A | 9/1991 | Yagi et al. |
| 5,071,792 | A | 12/1991 | Van Vonno et al. |
| 5,073,230 | A | 12/1991 | Maracas et al. |
| 5,223,450 | A | 6/1993 | Fujino et al. |
| 5,238,865 | A | 8/1993 | Eguchi |
| 5,597,766 | A | 1/1997 | Neppl |
| 5,665,607 | A | 9/1997 | Kawama et al. |
| 5,710,057 | A | * 1/1998 | Kenney .................... 437/62 |

FOREIGN PATENT DOCUMENTS

DE 196 54 791 9/1997

OTHER PUBLICATIONS

Patent Abstracts of Japan 07302889 A Manufacture of Semiconductor Substrate S. Kiyobumi et al.
Patent Abstracts of Japan 1–120850 (A) Manufacture of Semiconductor Substrate E–805 Aug. 14, 1989 vol. 31 (1992) vol. 13/No. 364 M. Miyajima.
"Bond Strength of Bonded SOI Wafers" Jpn. J. Appl. Phys. vol. 31 (1992) pp. 975–978 F. Sugimoto et al.
"Current Progress in Epitaxial Layer Transfer", IECICE Trans. Electron., vol. E80–C, No. 3 Mar. 1997 pp. 378–387) K. Sakaguchu et al (Reseach Doc. No. XP–000751691).
"SOI Materials For Mainstream CMOS Technology" Electrochemical Society Proceedings vol. 97–23 W.P. Maszara et al. (Research Doc. No. XP–000856433).

* cited by examiner

Primary Examiner—Wael Fahmy
Assistant Examiner—Neal Berezny
(74) Attorney, Agent, or Firm—Breiner & Breiner, L.L.C.

(57) ABSTRACT

The present invention relates to a method of producing very thin substrate layers, particularly thin semiconductor areas, which may comprise integrated circuits. In the method two substrates (1, 2) are bonded by their faces via one or several intermediate connecting layers (3, 4). At least one of the bonding layers or the face of one of the substrates is structured before in such a way that channel-shaped recesses (5) are formed which permit a lateral penetration of an etching agent. The resulting wafer stack is thinned from one side down to the desired thickness of the layer. Finally, this thin layer is detached from the remaining substrate by introduction of the etching agent into the channel-shaped recesses. This detaching process is a low-price wet chemical process that does not expose the chip and the added value integrated thereon to any risk.

27 Claims, 3 Drawing Sheets

METHOD FOR PRODUCING THIN SUBSTRATE LAYERS

FIELD OF APPLICATION

The present invention relates to a method of producing thin substrate layers, specifically thin semiconductor zones possibly containing integrated circuits.

It may be expedient for many present and future applications of electronic components and integrated circuits (ICs) in particular to restrict the overall thickness of these ICs or the semiconductor zones with the ICs to a few micrometers. Such thin circuits present a very low mass and have a very small overall height. They are mechanically flexible, adapt themselves to the thermo-mechanical behaviour of a substrate and reduce problems in disposal on account of their small volume. All these advantages may gain even more importance within the general framework of future disposable electronics. As early as to date thin electronic devices and circuits for fields of application such as flat panel displays, where ICs are bonded to glass, mechatronics, where the ICs are bonded to metal, and high-power electronics (transistors, thyristors, diodes with vertical conduction) are of great interest.

In silicon technology, integrated circuits are manufactured on substrates, the so-called wafers. These wafers consist of mono-crystalline silicon which present, in typical cases, a thickness of 700 μm and a diameter of 200 mm at present and of 300 mm in the near future. The definition of the thickness of the substrates to 700 μm offers several aspects in terms of manufacturing technology and also physics. For instance, the precision and the yield in slicing or sawing of the crystal rods drawn from the melt and their subsequent polishing, on the one hand, are important, on the other hand the mechanical stability and a sufficient thermal mass must be ensured during the actual processing of the ICs.

After the production of the integrated circuits or devices in terms of semiconductor technology the wafers and hence the individual chips of the wafer must be thinned to a residual thickness as small as 200 μm and even down to 120 μm at present in order to be suitable for integration into housings or on pc boards in particular.

Processing of the devices or circuits on cantilever wafers which are already thinned is normally ruled out because the mechanical stability, the thermal load-bearing capacity et. is by no means sufficient to this end below a thickness of 50 μm. Moreover, the process development and the entire manufacturing equipment are designed and set for wafers of conventional thickness.

The thinning of the completely processed wafer Is normally realised by polishing. In this process the rear side of the wafer is mechanically removed by means of a polishing paste and suitable abrasive-carrying agents up to the desired residual thickness. Being a monocrystalline substance, silicon cannot be subjected to chipping operations. In the course of polishing rather so-called micro-fissures occur, which are due to the crystalline nature and which may propagate up to the device region of the wafer and destroy the functional operability of the circuits if the process is inappropriately managed. As a consequence of this situation the residual thickness of the silicon substrates, that can be achieved by polishing, is restricted, as a rule to a thickness corresponding to 5 to 10 times the size of the abrasive grains.

One possibility to solve this problem consists in the use of very fine abrasive grains up to diameters of a few hundreds of nanometers, This entails, however, a dramatic reduction of the removal rate so that the thinning process requires a very long time.

For a reduction of the residual thickness below the values occurring in the conventional grinding process it is necessary, as a rule, to employ particularly gentle polishing methods. An appropriate process which attempts to combine the advantages of grinding, wet-chemical etching and so-called CMP (chemical mechanical polishing) is published, for instance, in the paper by D. Bollmann et al., Abstract No. 2115, Proceedings, The Electrochemical Society Meeting, Paris 1997. As an alternative, wet and also dry etching methods have been tried. The latter processes, however, lead to a high thermal load on the substrate and the devices applied thereon, with the necessary amount of the removal rate.

On principle, these methods involve the thinning of the wafer after processing of the circuits. The processes leading to thinning are thus performed on a wafer on the surface of which the entire high added value in chip production is already accumulated. Faulty thinning correspondingly leads to a reduction of the yield and hence in high losses in value. Moreover, the observation of the desired residual thickness is rendered rather difficult on account of the reduced possibility of (local) measurement of the residual thickness, which is impaired by the implemented devices.

A fundamental way out of the problems Involved in thinning of wafers presenting a high accumulated added value and in the complex thickness measurement consists in the application of so-called SOI wafers. SOI wafers carry an insulating layer buried just below the surface, as a rule in the form of an $SiO_2$ layer. There are several methods available for the production of such SOI wafers (cf., for instance, W. P. Maszara et al.: "SOI Materials for Mainstream CMOS Technology", in: SOI Technology and Devices VII, ed.: S. Christoloveanu, The Electrochemical Society Proceedings 97–23, 1997) which will be outlined in the following.

In SOS (silicon on sapphire) techniques an epitactical silicon layer is deposited on a polished $Al_2O_3$ crystal. This approach is successful as a result of the approximately equal lattice constant of both materials. However, crystalline $Al_2O_3$ wafers must be used, which renders this method very expensive and is applicable only in the case of extremely high-price applications.

In ZMR (zone melting recrystallization) technique polysilicon is deposited on a wafer covered with $SiO_2$ and then crystallised by a local fusing and solidifying process. The crystal quality, the crystallite size, etc. of these wafers does, as a matter of fact, no longer satisfy the demands current in today's CMOS technology.

In the SIMOX (Separation of implanted oxygen) technique a high-dose ion implantation just below the surface of the silicon wafer creates a stoichiometric SiO2 layer which, in the case of an appropriate process management, i.e. thorough healing of the crystal damage caused by implantation, leaves the extremely thin silicon layer monocrystalline that is located thereabove and will carry devices later on.

In the BESOI (bonded etched-back silicon on insulator) technique two oxidized silicon wafers are fixedly fastened on each other by thermal bonding and covalent bonds so established. Then one of the two wafers is thinned back to the useful thickness. A specific variant of the BESOI technology ("SmartCut® OR IonCut) uses special methods of thinning which are based on the implementation of a layer created by means of ion implantation and buried below the surface, along which layer the useful layer is split off that is bonded onto the second wafer (manipulating) wafer. This may be achieved by forming gas bubbles by means of hydrogen or helium implantation (cf. European Patent EP-A 0 533 551 or M. Bruel et al. in "Unibond SOI Wafers Achieved by Smart-Cut® Process" in: SoI Technology and Devices VIII, ed.: S. Christoloveanu, The Electromechanical Society Proceedings 97–23, 1997) or by detaching a fusing intermediate layer (cf. German Patent DE 1^95 46 179 A1). In both cases the production of a BESOI wafer is successful without repeated grinding or etching of major parts of a monocrystalline wafer laboriously produced before.

SOI wafers produced according to the SIMOX and BESOI processes have been developed up to a stage ready for application in the past few years. They are applied in the fields of application high-temperature electronics and "low power electronics" to an ever-increasing extent and are commercially available in high numbers of units.

Such SOI wafers may be used for the production of extremely thin ICs. The subsequent removal of the thick carrier wafer by grinding, wet or dry chemical etching, etc. may then be stopped expediently at the buried layer. In the case of mechanical grinding, and specifically its refined form of chemical mechanical polishing (CMP) the buried $SiO_2$ layer may serve as the mechanically hard stop layer. Furthermore, it is possible that mechanical defects such as micro-cracks cannot or only hardly penetrate through the amorphous $SiO_2$ layer. In the case of wet chemical down-etching the high selectivity (better than 1:100) of the normally oxidizing silicon etching process results in a reliable etching stop at the buried oxide layer. In the case of the less selective dry etching processes, e.g. by application of $NF_3$ plasma, the $SiO_2$ layer may equally serve as selective stop layer. In view of the decreasing lateral conductivity, furthermore a local self-restriction of the etching process may be utilised.

One advantage in the application of SOI wafers resides in the aspect that the process resulting in subsequent thinning, i.e. the implementation of a buried layer underneath the silicon of the useful wafer, is performed before the processing proper in terms of semiconductor technology. As a consequence, firstly a high added value is not endangered, and secondly it is possible to use particularly simple optical or even acoustic measures of measuring the thickness because at this stage the wafer does not yet present any local structures, metals, etc. which render a non-contacting and precise measurement of the thickness more difficult or preclude it entirely.

However, the removal of the thick manipulating wafer by means of grinding or etching means that the monocrystalline silicon is destroyed over a substantial thickness, with a resulting expenditure in terms of time.

The present invention is therefore based on the problem of proposing a low-cost and rapid method of producing thin substrate layers, which is suitable to produce extremely thin ICs and avoids the afore-described problems.

This problem is solved with the method according to claim 1. Expedient embodiments of the method are the subject matters of the dependent claims. Moreover, the claims 29 to 47 define substrate systems which constitute an essential key product in realising the method.

In the inventive method, which will also be referred to as RevSOI (reversible SOI technique) a first substrate and a second substrate are bonded to each other by their faces via one or several intermediate bonding layers. At least one of the bonding layers or the face of one of the substrates is so configured that it presents channelshaped recesses permitting a lateral penetration of an etching agent. Subsequently, the first substrate is thinned from the rear side down to a thin substrate layer. This thin substrate layer is subsequently detached from the second substrate by the introduction of the etching agent into the channel-shaped recesses.

The two substrates are preferably semiconductor wafers for the production of ICs.

These wafers are processed in the same manner as that common within the general framework of IC or single-device production. Sagging does not occur on the wafers as long as the width of the channels (preferably 0.1–2 $\mu$m) ranges at a fraction of the thickness of the useful layer of the semiconductor layer (typically 0.5–20 $\mu$m).

After processing the structured bonding layer serves as sacrificial layer. This layer is laterally accessible, at any time, either from the side of the wafer or, in the case of a preferred embodiment, as soon as the hermetically sealed wafer edge is removed/opened. This is automatically done particularly when the wafer is subdivided to form chips. Before, the thin chips are expediently fixed on a carrier substrate.

The separation of the useful layer from the bulk layer is preferably carried out by wet chemical etching. In this step the etching agent (such as HF) is aspirated into the channels under the effect of capillary forces. The driving forces are the chemical reaction and the surface tension. The rate of flow or the throughput quantity, respectively, is described in approximation by the Hagen-Poiseuille law and depends on the channel lumen in the fourth power. In large-area chips or generally in the separation of large-area wafer zones the removal of the reaction products (e.g. $SiF_4$) may be assisted by ultrasound, centrifugal force, thermal gradients (generated, for instance, by means of IR laser radiation) etc.

Moreover, vertical holes or slots may be provided or etched in the useful layer for the supply and extraction of the etching agent. For supplying or extracting the etching agent, the cleaving or sawing frame produced between the chips is expediently used.

The channel-shaped recesses need not necessarily extend along linear orientations. They need not present a rectangular cross-section either necessarily. In particular, the vertical walls or edges of the channels may also present an orientation varying from 90° relative to the surface. Due to the specific engineering features of the etching operation, particularly in the case of etching under the mask in wet chemical etching, this edge bevelling may occur all by itself. On the other hand, however, special methods may be applied for edge bevelling or edge projection. Edge projection or cantilevering leads to the advantage of a relative enlargement of the bonding oxide area. Methods of taking an influence on the inclination of the etching edge are common to those skilled in the art within the general framework of the wet and dry etching techniques applied in semiconductor technology.

The aforementioned method may be extended or modified by the provision that the channels are not or not exclusively created in the bonding layer or layers but rather completely or partly in the substrates as such. In the case of a rectangular cross-section, this may lead to an enlargement of the lumen. A practical limit is set by the mechanical characteristics of the substrates (buckling under thermal strain, warping).

In particular, one can dispense with an oxide cover in at least one of the two wafers to be bonded. In this case the natural oxide, which is always present on wafers exposed to air, serves as bonding area.

In a preferred embodiment the fact is utilised that the buried insulating layer is freely accessible in BESOI wafers before both wafers are joined to form the BESOI assembly.

It is also accessible for structuring of the bonding oxide in particular. One or both of the two wafers typically carries an SiO$_2$ layer roughly 1 μm thick. Prior to joining trenches are etched in one or both oxides, to which end the wafer edge carries a coherent annular oxide zone. Then both wafers are joined by thermal bonding in the usual manner, and one of the two wafers is thinned by means of one of the current thinning methods (grinding, etching, IonCut) described with respect to the BESOI technique to achieve the desired thickness of the useful layer.

Subsequently, circuits are formed with the usual technology on this BESOI wafer. During production, for which thermal and also vacuum or gas phase processes in particular are employed, the wafer is hermetically closed on the edge by the oxide ring. After completion of the circuits and opening of the coherent edge layer located on the wafer or also after subdivision of the wafer into chips the buried oxide layer, specifically the channels in the oxide provided therein, is laterally accessible. An etching agent such as hydrofluoric acid may penetrate into these channels and etch into the bonding oxide. The thin chip, which is preferably previously fixed by its face on a holding substrate for mechanical support, is typically detached within the range of minutes in the case of edge lengths of roughly 10 mm.

The detachment is a low-price wet chemical process which hardly exposes the chip and the added value integrated thereon to any risk.

It is particularly simple to check the thickness of the layer in thinning of the BESOI wafer by the presence of the burled cavities (trenches) with local resolution by means of acoustical microscopy.

As an alternative, the IonCut technique is applicable where grinding and measurement of the thickness of the layer are avoided.

The trenches present in the bonding layer produce an expedient effect on the bonding operation. It is common knowledge that wafers with a scratched surface have better bonding properties. This is traced back to the easier diffusion of residual gases, adsorbed moisture, etc. during the beginning bonding operation for which the presence of water (hydrophilic surface) is expedient.

The wafer edge or possibly also various elementary zones are preferably free of laterally accessible channels. This can be clearly seen both in FIG. 2b and in FIG. 3. The wafer should be hermetically sealed after bonding and tolerate all processes applied within the general framework of semiconductor device production.

The BESOI bonding process may be performed in particular in a vacuum or equally in special oxidizing or reducing atmospheres.

One advantage of accessibility of the sacrificial layer or "zipper layer"during the production of the RevSoi wafer resides in the fact that the cavities may be filled with specific gases.

In an expedient embodiment the bonding operation is performed with the addition of trace gases, helium in particular. On account of the enclosed gas it is particularly simple to check the bonded wafer for tightness (helium leakage test).

In another embodiment doping gases are enclosed in order to create a highly doped buried layer or a gettering layer.

The essential feature of the lateral accessibility of the insulating oxide layer may also be utilised in an approach to metallize the internal surfaces of the channels by means of a liquid or a gaseous metal compound and organometallic compounds in particular.

The present invention will be described again in the following by embodiments with reference to the Figures wherein:

FIG. 1 shows a schematic example of a flowchart of the entire production process.

Figure 1:
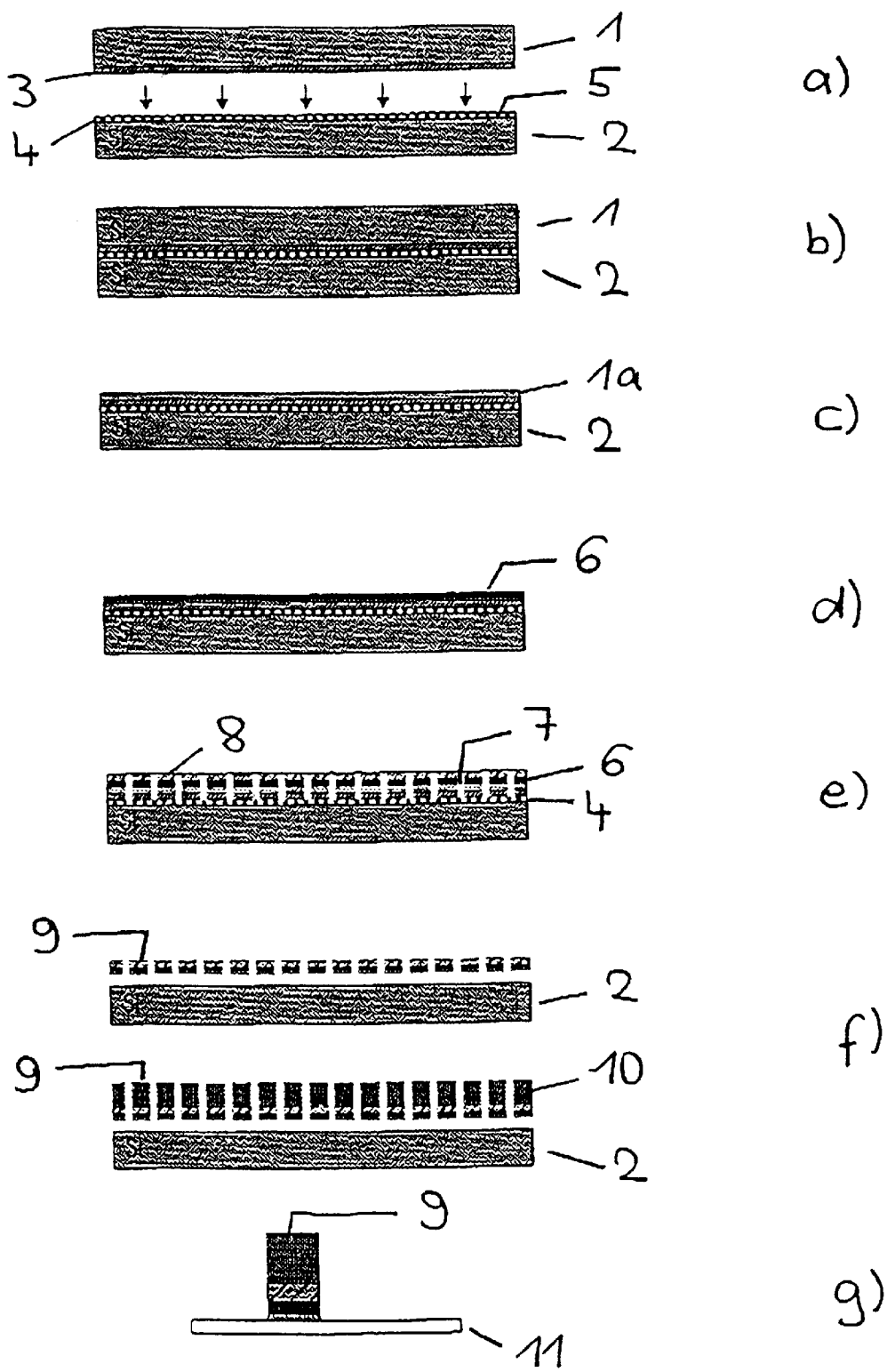
FIG. 1 is a schematic illustration of a flowchart of the inventive production process.

Initially two wafers (1, 2), whereof each carries an oxide layer (3, 4) on a surface, are made available. The oxide layer (4) of one of the wafers is so structured that strip-shaped channels (5) are created which extend over the entire surface. The structures are transferred by one or two preferably non-adjusted photo techniques into the oxide (4). The two wafers are bonded by their oxidized surfaces, preferably by the SFB (silicon fusion bonding) technique, as is illustrated in FIGS. 1a and 1b.

Then a process follows like in case of BESOI production, wherein the stack of wafers created by bonding is thinned from the rear side of one of the substrates down to the desired thickness of the semiconductor zone (1a).

Then the normal IC process, e.g. a CMOS process, may be performed to produce circuits and/or single devices (6) in the semiconductor layer (1a) of the thinned substrate (1).

After this step dry etching or wet etching of trenches (7) takes place, as is illustrated in FIG. 1e), for the subsequent subdivision of the chips, which trenches are, however, substantially narrower than usual, mechanically created cleaving or sawing lines. The trenches (7) extend up to the buried structured oxide layer (4). Mechanical cleaving or sawing of the trenches is possible, too.

In the etching process the surface of the ICs (6) must be protected. This is done by applying a layer (8), e.g. a nitride of photo resist layer. This protective layer (8) may then either be tom off again or remain as protective layer for the chip detaching process. When the layer (8) is removed before a new protective layer (10), preferably a photo resist layer, musts be applied before the detaching process, as is illustrated in FIG. 1f.

By the preceding trench etching process the channels (5) were exposed in the buried oxide layer (4) (cf. FIG. 1e) so that in the subsequent detaching process, which is preferably performed with HF, the etching liquid can penetrate into the channels (5) and detach the individual chips (9) from below, as is evident from FIG. 1f. In this detaching process the selectivity of oxide relative to silicon is utilized in etching.

The wafer can be mechanically supported from the face by means of a manipulating wafer prior to detachment. This manipulating wafer should, however, present appropriate channels for introducing the etching liquid.

The subdivided, completely processed chips (9) may be applied on a substrate (11) subsequently.

A particularly expedient configuration is illustrated in FIG. 2a that shows the employed wafer both in a plan view and a cross-sectional view. Both wafers (1, 2) carry an SiO$_2$ layer (3, 4), roughly 1 μm thick, that is structured with typical line widths (s, b) of 1–2 μm approximately. Moreover, the right side of the Figure shows also the starting wafer (1) prior to structuring as an example. The layer is structured by a wet chemical and non-adjusted process, i.e. this structuring process is hence suitable for low-cost production. Restrictions in terms of structure and orientation of these $SiO_2$ trenches or channels may derive from the anisotropic mechanical properties of the crystalline wafers (wafer sagging).

In this example, the layers are structured on both Si wafers (1, 2) in such a way that the trenches extend at an angle of 90° relative to each other after the wafers have been joined. With this provision a better distribution of the etching liquid can be achieved in the subsequent detaching process. In this example, two different trench structures are selected for illustration purposes. The $SiO_2$ layer of the first wafer (1) presents, for instance, trenches which penetrate through the entire thickness h1 of the layer whilst the trenches present a depth as small as H3 in the other wafer (2) so that a residual thickness H2 (h3+h2=h1) of the layer is retained over the entire area.

FIG. 2b finally illustrates a modification of the structure of the two layers of the wafer. Here each of the layers remained in the edge zone of the wafers remained unstructured so that after wafer joining a hermetically sealed wafer stack is obtained.

Figure 2:
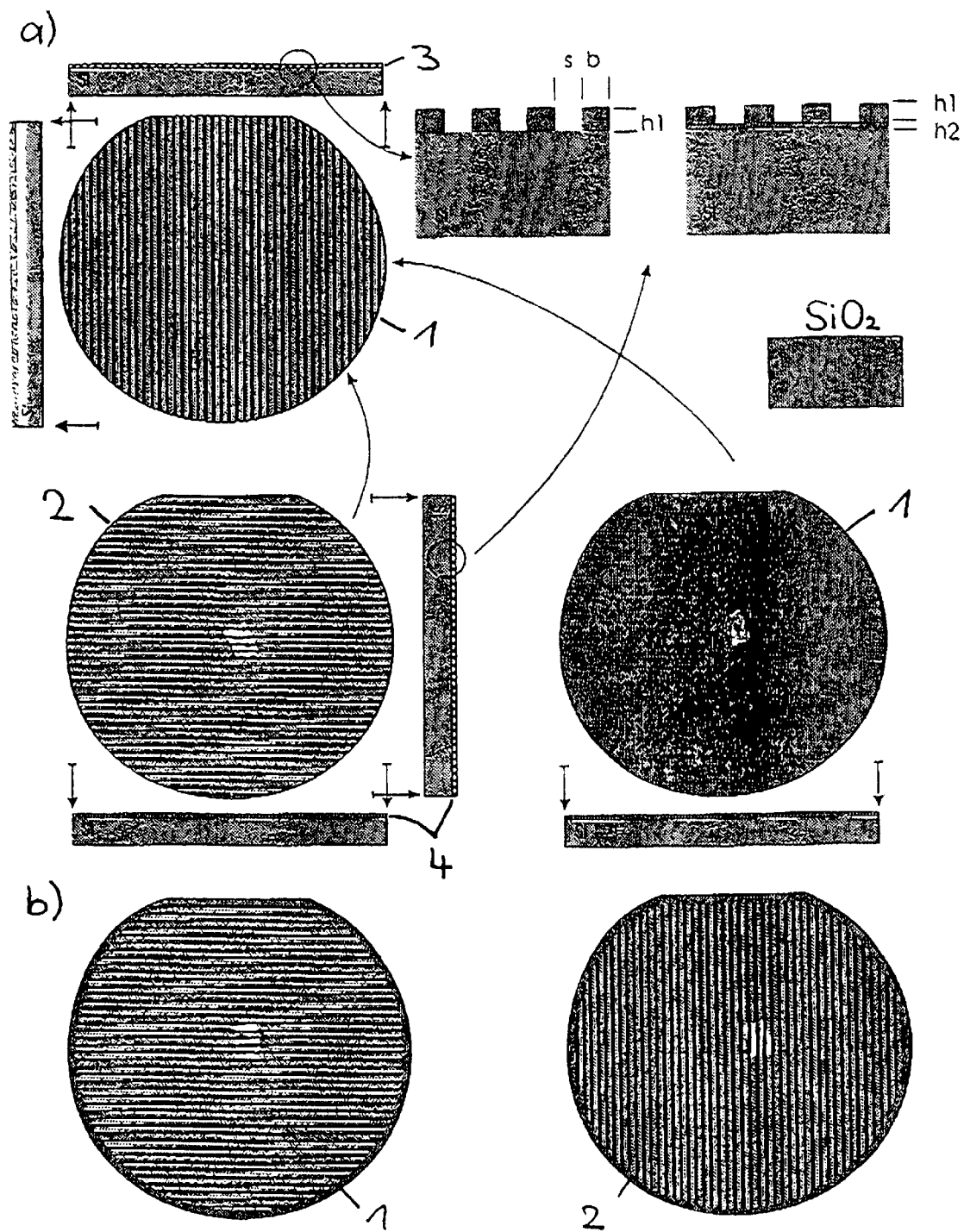
FIG. 2 shows examples of structuring the bonding layers on the substrate surface.

These wafers shown in FIG. 2 are joined to each other and thinned from one side, as is explained with reference to FIG. 1. The resulting wafer with the thin semiconductor zone (1a) as useful layer and integrated "zipper layer" constitutes the basis of the inventive RevSOI (reversible SOI) technique.

In all embodiments the geometric configuration of the channels (5), specifically the shape of their lateral extension, the subdivision into areas separated from each other in a hermetically sealed manner is entirely free of the formation of bonding islets etc. However, it should duly consider the marginal conditions "bonding force" and wafer or substrate bending, which are necessary for stable bonding, and ensure at the same time an efficient transfer of the etching agent.

Exemplary shapes of the channels (5) in both substrates are rectangular structures, round, meandering or polygon-type structures. The structure should, on the one hand, offer a maximum mechanical stability for the silicon membrane (1a) and, on the other hand, render the detaching process as simple and rapid as possible. This means that after penetration into the channels (5) the etching liquid should corrode as uniformly as possible on all points and ensure a rapid detachment of the ICs. The spacings of the channels are variable, too. Examples of different cross-sectional shapes of the channels (5) are illustrated in FIG. 3, where the structuring may be performed also as far as into the substrate as such.

Figure 3:
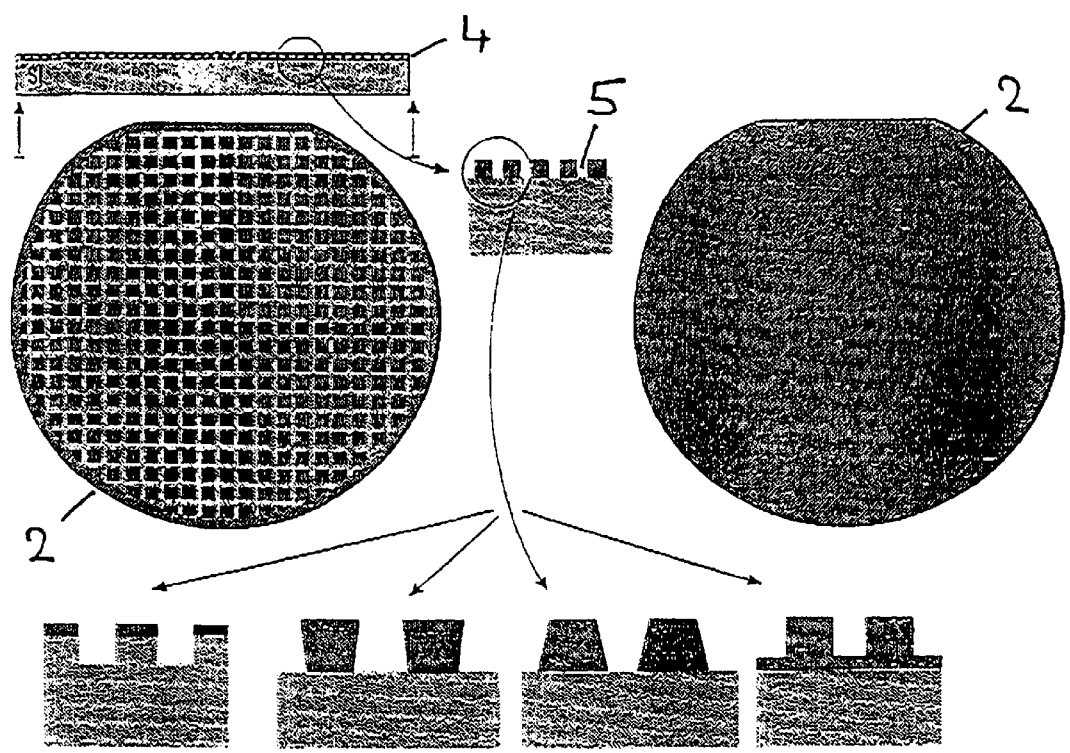
FIG. 3 illustrates a further example of structuring as well as examples of the cross-sectional shape of the channel-shaped recesses on the bonding areas of the substrates.

The bonding layer may be structured in the form of islets or in strip or puncti-form shape FIG. 3 illustrates an islet-type structuring in the form of a lattice structure (right side: non-structured layer, left side: structured layer).

The islet-shaped structuring presents the advantage, in addition to the better distribution of the etching liquid, that mechanical strain will be avoided in the wafer. Continuous strips as channels produce a greater influence than a bonding layer structured in the form of islets.

The cross-section through the channels may equally be optimized in consideration of the aforementioned aspects, i.e. mechanical stability and rapid detachment of the ICs.

Either the surfaces of both wafers or substrates to be bonded, or only one of them, may be structured. For better bonding of the two wafers both should present an oxide layer. However, this Is not necessarily necessary.

Doped oxides, particularly the PSG, TEOS, PECVD, LPCVD, APCVD and BPSG oxides used in CMOS processes, may also be used instead of pure oxide as materials for the bonding layers. This provision is suitable to increase the etching rate in chip detachment.

As a variant of the method for separation or detachment it is also possible to apply the anodic oxidation, specifically for silicon wafers. In this variant an electrical voltage is applied to both silicon wafers or wafer layers, respectively, which are bonded via the insulating layer, which voltage results in a flow of current and in an electrolytic decomposition of the electrodes by means of anodic oxidation. In this process the liquid migrates under the bonding oxide, with a resulting detachment and separation of both elementary silicon wafers due to enlargement of the volume in oxide formation.

The bonding strength of wafers structured in accordance with the present invention is reduced by the reduced bonding area. Whilst the normal bonding force of conventional BESOI wafers ranges at <800 kp/cm$^2$ it amounts still to 200 kp/cm$^2$ in the lattice structure illustrated in FIG. 3, due to the bonding area factor reduced to 25%. This is sufficient in any case to resist the thermal strain occurring during the further processing (thermal budget in chip production) and also the expansion-induced pressure of the gas enclosed in bonding (max. 4 bar at 1200 K). A channel web width (pitch) of 1 $\mu$m in typical cases does not result in any troublesome local or global bending with a useful silicon thickness of 10 $\mu$m in typical cases.

What is claimed is:

1. Method of producing thin substrate layers comprising:
    a first semiconductor substrate and a second substrate are bonded by their faces via one or several intermediate bonding layers, with at least one of said bonding layers or the face of one of said substrates presenting channel-shaped recesses having a cross-section such that a lateral penetration of an etching agent will become possible;
    said first substrate is thinned from the rear side down to a substrate layer; and
    said substrate layer is detached from said second substrate by introducing the etching agent into said channel-shaped recesses.

2. Method according to claim 1, wherein that said channel-shaped recesses are created in the form of a strip pattern.

3. Method according to claim 1, wherein that said channel-shaped recesses are created in the form of a lattice structure.

4. Method according to claim 1, wherein that said channel-shaped recesses are created in said bonding layer in such a way that they do not completely penetrate through said bonding layer.

5. Method according to claim 1, wherein that said channel-shaped recesses are created with a cross-sectional area in the range from 0.1 to 10 $\mu m^2$.

6. Method according to claim 1, wherein that said first substrate is thinned down to a substrate layer with a thickness of less that 50 $\mu$m.

7. Method according to claim 1, wherein that said channel-shaped recessed are so created that they do not extend up to the edge of said substrates so that the interstice formed between both substrates by said channel-shaped recesses is hermetically sealed by bonding said substrates.

8. Method according to claim 1, wherein that said channel-shaped recesses are so created that several closed interior zones are formed between both substrates, which are hermetically sealed.

9. Method according to claim 1, wherein that a quartz substrate is used as said second substrate.

10. Method according to claim 1, wherein that the two elementary substrates of a BESOI wafer are used as first and second substrates, with said bonding layers being the insulator layers of the BESOI wafer.

11. Method according to claim 1, wherein that prior to detachment said substrate layers is subjected to processing for producing devices and/or integrated circuits in said substrate layer.

12. Method according to claim 11, wherein that prior to detachment, the bonded substrates are subdivided into smaller units, particularly chips, with single circuits.

13. Method according to claim 11, wherein that prior to detachment, said bonded substrates are subdivided into small linear units having a line width of one chip or a multiple thereof, and line lengths corresponding to the length of several chip up to the complete substrate width.

14. Method according to claim 11, wherein that prior to detachment, vertical openings or trenches, specifically in the form of cleaving or sawing lines, are created between individual integrated circuits via which the etching agent is introduced.

15. Method according to claim 1, wherein that said bonding layer is an oxide layer or SiC layer.

16. Method according to claim 15, wherein that an insulating layer consisting of $SiO_2$ in pure or doped form, particularly BSG or BPSG, is used as oxide layer.

17. Method according to claim 1, wherein that hydrofluoric acid or an etching solution substantially containing hydrofluoric is used as etching agent.

18. Method according to claim 1, wherein that a gas or plasma appropriate for etching is used as etching agent, which burns in the cavities between both substrates in response to the application of an electric field.

19. Method according to claim 1, wherein that the bonding of said two substrates is performed by a bonding operation in the presence of a gas so that this gas is enclosed in said channel-shaped recesses.

20. Method according to claim 19, wherein that an inert, an oxidizing or a reducing gas is used.

21. Method according to claim 19, wherein that a gas suitable for testing the bond for leakage, specifically helium, is used either alone or in admixed form.

22. Method according to claim 19, wherein that a gas serving for silicon doping, such as $PH_3$, POCl or $B_2H_6$, is enclosed in said channel-shaped recesses when the substrates are bonded.

23. Method according to claim 1, wherein that said etching agent is passed through said channel-shaped recesses by means of pressure.

24. Method according to claim 1, wherein that the detachment is assisted by an electric current that results in chemical reactions on both substrates held together by said bonding layer.

25. Method according to claim 1, wherein that the detachment is supported and thus accelerated by ultrasound, heat and/or centrifugal force.

26. Method according to claim 1, wherein that said channel-shaped recesses are coated with a thin metal layer completely or partly on laterally oriented areas under the action of a metal-containing compound.

27. Method according the claim 26, wherein that the coating is performed by means of thermally decomposing organometallic compound or a currentless or galvanic deposition.

* * * * *